United States Patent
Kang et al.

(10) Patent No.: US 9,015,392 B2
(45) Date of Patent: Apr. 21, 2015

(54) MULTI-CHIP PACKAGE AND OPERATING METHOD THEREOF

(75) Inventors: Won-Kyung Kang, Gyeonggi-do (KR); Sam-Kyu Won, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 329 days.

(21) Appl. No.: 13/572,086

(22) Filed: Aug. 10, 2012

(65) Prior Publication Data
US 2013/0307611 A1 Nov. 21, 2013

(30) Foreign Application Priority Data
May 21, 2012 (KR) .................. 10-2012-0053742

(51) Int. Cl.
G06F 13/00 (2006.01)
G11C 5/14 (2006.01)
(52) U.S. Cl.
CPC ........................................ G11C 5/14 (2013.01)

(58) Field of Classification Search
USPC .................. 710/100, 105, 106, 107
See application file for complete search history.

(56) References Cited

U.S. PATENT DOCUMENTS

| | | | |
|---|---|---|---|
| 2007/0076502 A1* | 4/2007 | Pyeon et al. | 365/221 |
| 2009/0027939 A1* | 1/2009 | Kang | 365/51 |
| 2012/0032706 A1* | 2/2012 | Kim et al. | 327/108 |
| 2012/0140579 A1* | 6/2012 | Kim et al. | 365/189.07 |
| 2014/0063973 A1* | 3/2014 | Shibata et al. | 365/185.22 |

FOREIGN PATENT DOCUMENTS

KR 1020120005233 1/2012

* cited by examiner

*Primary Examiner* — Glenn A Auve
(74) *Attorney, Agent, or Firm* — IP & T Group LLP

(57) ABSTRACT

A multi-chip package includes first and second semiconductor chips each configured to perform first and second operations having different current consumptions. The first and second semiconductor chips perform the first operation in response to an enable control signal transmitted from one of the first and second semiconductor chips to the other and transmitted from the other back to the one.

17 Claims, 2 Drawing Sheets

MULTI-CHIP PACKAGE AND OPERATING METHOD THEREOF

CROSS-REFERENCE TO RELATED APPLICATIONS

The present application claims priority of Korean Patent Application No. 10-2012-0053742, filed on May 21, 2012, which is incorporated herein by reference in its entirety.

BACKGROUND

1. Field

Exemplary embodiments of the present invention relate to semiconductor design technology, and more particularly, to a multi-chip package including a plurality of semiconductor chips.

2. Description of the Related Art

In general, semiconductor devices including DDR SDRAM (Double Data Rate Synchronous DRAM) are developing to satisfy users' various needs. For such a development direction, package technology of semiconductor devices has been proposed. For example, a multi-chip package has been developed as the package technology. The multi-chip package refers to a structure for forming one single chip using a plurality of semiconductor chips. Depending on the configurations of the multi-chip package, a plurality of semiconductor chips having a memory function may be used to increase a storage capacity, or a plurality of semiconductor chips having different functions may be used to improve performance.

For reference, the multi-chip package may be divided into a single-layer multi-chip package and a multilayer multi-chip package. The single-layer multi-chip package includes a plurality of semiconductor chips arranged in parallel on a plane, and the multilayer multi-chip package includes a plurality of semiconductor chips stacked and arranged therein.

As semiconductor devices have been miniaturized, an error related to a peak current has been raised. In order to control a miniaturized circuit, a low-level voltage is to be used. At this time, when a peak current occurs, a voltage drop occurs to cause a malfunction of the circuit. Particularly in a multichip package, when operation periods of a plurality of semiconductor chips overlap each other, a peak current may occur to cause a voltage drop. In this case, the voltage drop may cause a malfunction of the multi-chip package as well as malfunctions of some semiconductor chips. Therefore, the multi-chip package is being developed to prevent the error related to the peak current from occurring.

SUMMARY

An exemplary embodiment of the present invention is directed to a multi-chip package capable of controlling operation periods of a plurality of semiconductor chips.

In accordance with an exemplary embodiment of the present invention, a multi-chip package includes first and second semiconductor chips each configured to perform first and second operations having different current consumptions, wherein the first and second semiconductor chips are configured to perform the first operation in response to an enable control signal transmitted from one of the first and second semiconductor chips to the other and transmitted from the other back to the one.

In accordance with another exemplary embodiment of the present invention, a multi-chip package system includes a plurality of semiconductor chips each configured to perform first and second operations having different current consumptions, and a controller configured to select one of the plurality of semiconductor chips to generate an enable control signal and circulate the enable control signal through the plurality of semiconductor chips, wherein the plurality of semiconductor chips are controlled to perform the first operation in response to the enable control signal.

In accordance with yet another exemplary embodiment of the present invention, a multi-chip package system includes a plurality of semiconductor chips each configured to perform first and second operations having different current consumptions and generate operation information corresponding to the first operation, and a controller configured to transmit an enable control signal to the semiconductor chips in response to the respective operation information transmitted from the semiconductor chips.

In accordance with still another exemplary embodiment of the present invention, there is provided an operating method of a multi-chip package which includes a plurality of semiconductor chips each configured to perform a first operation in response to an enable control signal circulating through the plurality of semiconductor chips, comprising determining whether one of the semiconductor chips is selected to perform the first operation or not, determining whether the one of the semiconductor chips receives the enable control signal or not in response to a result of the determining of whether the one of the semiconductor chips is selected or not, performing the first operation in the one of the semiconductor chips in response to a result of the determining of whether the one of the semiconductor chips receives the enable control signal or not, and transmitting the enable control signal from the one of the semiconductor chips to another of the semiconductor chips.

DETAILED DESCRIPTION

Figure 1:
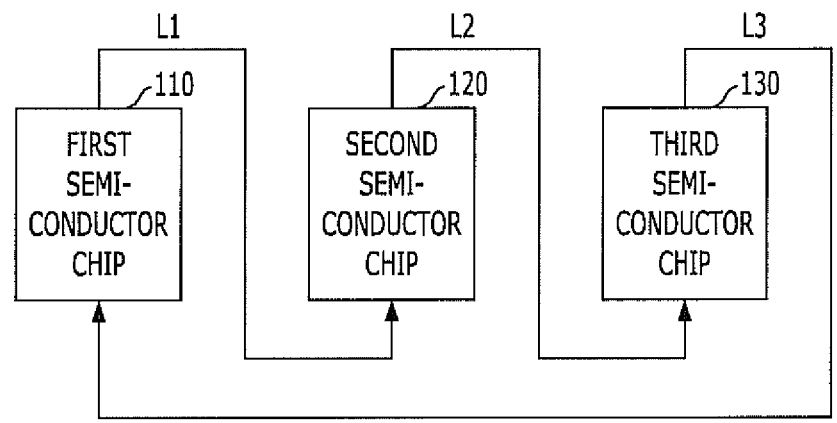
FIG. 1 is a block diagram illustrating the configuration of a multi-chip package in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram explaining the configuration of a multi-chip package in accordance with an exemplary embodiment of the present invention. For the illustrative purposes, FIG. 1 illustrates the multi-chip package including three semiconductor chips.

Referring to FIG. 1, the multi-chip package includes a first semiconductor chip 110, a second semiconductor chip 120, and a third semiconductor chip 130.

Each of the first to third semiconductor chips 110 to 130 performs various circuit operations including a circuit operation having a large current consumption, that is, a circuit operation causing a peak current. Hereinafter, the circuit operation causing a peak current is referred to as 'peak current operation', and the other circuit operations are referred to as 'normal current operations'. In other words, the first to third semiconductor chips 110 to 130 perform various circuit operations. Depending on the circuit operations, each of the first to third semiconductor chips 110 to 130 performs a peak current operation or a normal current operation.

Meanwhile, the first to third semiconductor chips 110 to 130 perform a peak current operation in response to an enable control signal which circulates through the first to third semiconductor chips 110 to 130. Here, the enable control signal may be generated by any one of the first to third semiconductor chips 110 to 130 and transmitted from the first semiconductor chip 110 to the second semiconductor chip 120, from the second semiconductor chip 120 to the third semiconductor chip 130, and from the third semiconductor chip 130 to the first semiconductor chip 110 through first to third signal transmission lines L1 to L3.

In this exemplary embodiment of the present invention, a case in which three semiconductor chips are used is shown as an example for description purposes. When two semiconductor chips are used, only one signal transmission line may be provided to circulate the enable control signal.

Hereinafter, a simple circuit operation will be described. For description purposes, it is described as an example that the first semiconductor chip 110 generates the enable control signal.

The enable control signal generated by the first semiconductor chip 110 is transmitted to the second semiconductor chip 120 through the first signal transmission line L1, and the second semiconductor chip 120 performs a peak current operation in response to the enable control signal. Then, after the second semiconductor chip 120 completes the peak current operation, the enable control signal is transmitted to the third semiconductor chip 130 through the second signal transmission line L2, and the third semiconductor chip 130 performs a peak current operation in response to the enable control signal. Finally, after the third semiconductor chip 130 completes the peak current operation, the enable control signal is transmitted to the first semiconductor chip 110 through the third signal transmission line L3, and the first semiconductor chip 110 performs a peak current operation in response to the enable control signal.

The multi-chip package in accordance with the embodiment of the present invention controls the peak current operations of the respective semiconductor chips using the enable control signal circulating through the semiconductor chips. Therefore, the peak current operation periods of the respective semiconductor chips do not overlap each other, which means that the multi-chip package may avoid a peak current period wherein two or more semiconductor chips performs the respective peak current operations.

Figure 2:
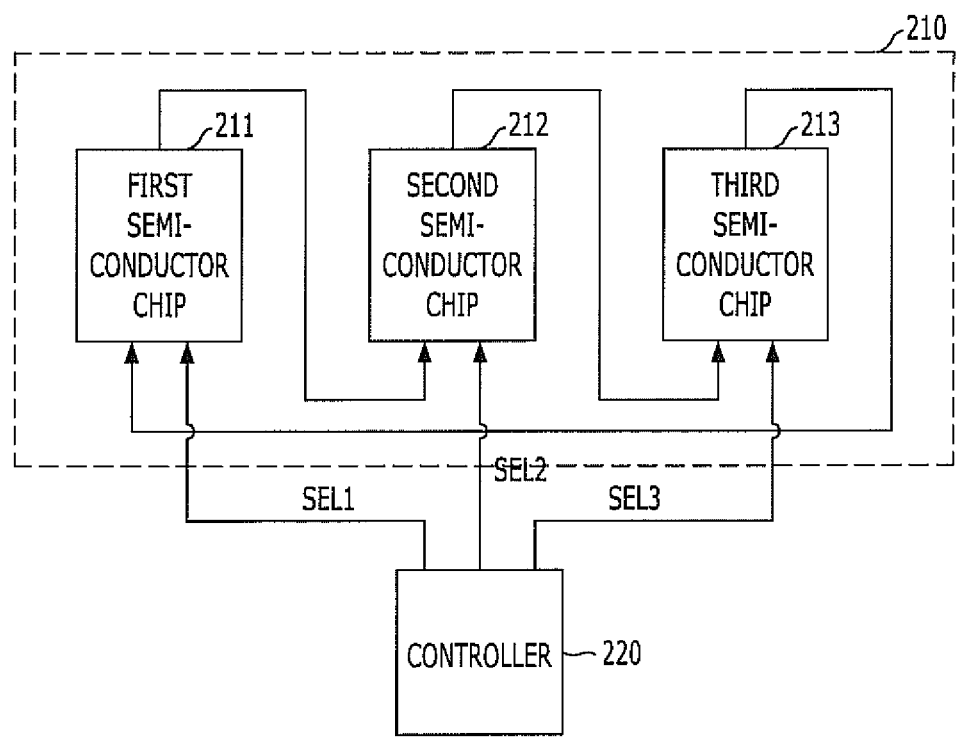
FIG. 2 is a block diagram illustrating the configuration of a multi-chip package system in accordance with another exemplary embodiment of the present invention.

FIG. 2 is a block diagram illustrating the configuration of a multi-chip package system in accordance with another exemplary embodiment of the present invention. For description purposes, it is described as an example that the multi-chip package system includes three semiconductor chips.

Referring to FIG. 2, the multi-chip package system includes a plurality of semiconductor chips 210 and a controller 220.

Each of the semiconductor chips 210 performs a peak current operation and a normal current operation. In particular, the peak current operation of a semiconductor chip is controlled in response to an enable control signal outputted from a previous semiconductor chip. For example, the peak current operation of the second semiconductor chip 212 is controlled in response to the enable control signal outputted from the first semiconductor chip 211.

The controller 220 serves to control any one of the semiconductor chips 210 to generate the enable control signal. The controller 220 is configured to activate a select signal corresponding to a semiconductor chip which is to generate the enable control signal, among the first to third semiconductor chips 211 to 213.

Hereinafter, a simple circuit operation will be described. For description purposes, it is described as an example that the controller 220 controls the first semiconductor chip 211 to generate the enable control signal.

First, the controller 220 activates a first select signal SEL1 corresponding to the first semiconductor chip 211, and the first semiconductor chip 211 generates the enable control signal in response to the first select signal SEL1 The enable control signal generated in such a manner may be preferentially used in the first semiconductor chip 211 or transmitted to the second semiconductor chip 212, depending on the circuit operation. Then, the enable control signal controls the peak current operations of the first to third semiconductor chips 211 to 213 while circulating through the first to third semiconductor chips 211 to 213.

The multi-chip package system in accordance with the embodiment of the present invention may control any one of the first to third semiconductor chips 211 to 213 to generate the enable control signal, in response to the first to third select signals SEL1 to SEL3 generated by the controller 220. Furthermore, the enable control signal generated in such a manner controls the circuit operations while circulating through the plurality of semiconductor chips 210, such that the peak current operations of the respective semiconductor chips 210 do not overlap each other.

Figure 3:
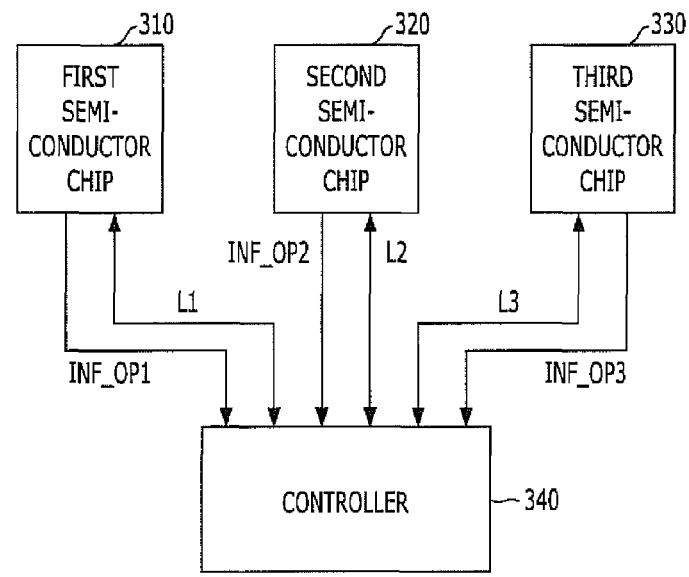
FIG. 3 is a block diagram illustrating a multi-chip package system in accordance with another exemplary embodiment of the present invention.

FIG. 3 is a block diagram illustrating a multi-chip package system in accordance with another exemplary embodiment of the present invention. For description purposes, it is described as an example that the multi-chip package system includes three semiconductor chips.

Referring to FIG. 3, the multi-chip package system includes first to third semiconductor chips 310 to 330 and a controller 340.

Each of the first to third semiconductor chips 310 to 330 performs a peak current operation and a normal current operation. Furthermore, the first to third semiconductor chips 310 to 330 generate first to third operation information INF_OP1 to INF_OP3 corresponding to the peak current operations thereof, respectively, and transmits the generated information to the controller 340.

The controller 340 is configured to transmit an enable control signal through first to third signal transmission lines L1 to L3 in response to the first to third operation information INF_OP1 to INF_OP3.

Hereinafter, a simple circuit operation will be described. For description purposes, it is described as an example that the second semiconductor chip 320 among the first to third semiconductor chips 310 to 330 preferentially performs a peak current operation, and the first or third semiconductor chip 310 or 330 then performs a peak current operation.

First, before the peak current operation, the second semiconductor chip 320 generates the second operation information INF_OP2 indicating that it will perform the peak current operation and transmits the second operation information INF_OP2 to the controller 340. The controller 340 transmits the enable control signal to the second semiconductor chip 320 through the second signal transmission line L2 in response to the second operation information INF_OP2. Then, the second semiconductor chip 320 receiving the enable control signal performs the peak current operation and transmits the enable control signal to the controller 340 after completing the peak current operation.

Then, when the first or third semiconductor chip 310 or 330 generates the first or third operation information INF_OP1 or INF_OP3 indicating that it will perform the peak current operation, the controller 340 transmits the enable control signal to the corresponding semiconductor chip, and the semiconductor chip performs the peak current operation in response to the enable control signal.

In the multi-chip package system in accordance with the embodiment of the present invention, the first to third semiconductor chips 310 to 330 generate the first to third operation information INF_OP1 to INF_OP3 corresponding to the peak current operations, and the controller 340 transmits the enable control signal to the corresponding semiconductor chip in response to the operation information. As a result, while the enable control signal is circulated through the first to third semiconductor chips 310 to 330 by the controller 340, the peak current operations of the first to third semiconductor chips 310 to 330 are controlled not to overlap each other.

Figure 4:
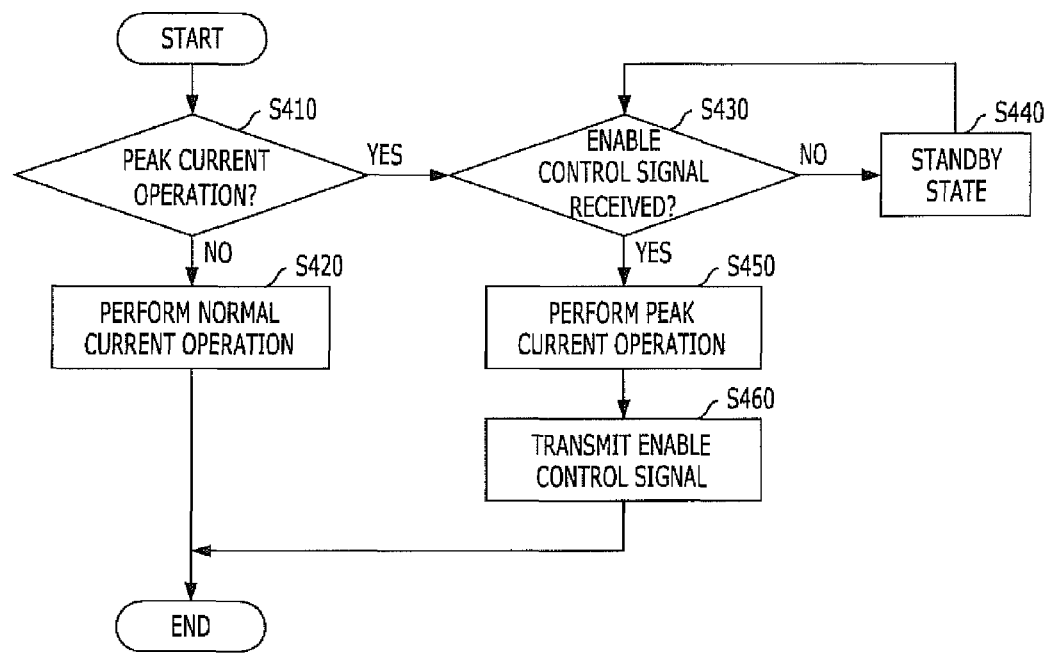
FIG. 4 is an operation flow chart illustrating circuit operations of a plurality of semiconductor chips illustrated in FIGS. 1 and 2.

FIG. 4 is an operation flow chart illustrating the circuit operations of the plurality of semiconductor chips illustrated in FIGS. 1 and 2. For description purposes, the following descriptions will be focused on the circuit operation of one semiconductor chip among the plurality of semiconductor chips.

Referring to FIG. 4, an operating method of the multi-chip package includes determining whether a circuit operation is a peak current operation or not at step S410, performing a normal current operation at step S420, determining whether an enable control signal was received or not at step S430, waiting for an operation at step S440, performing the peak current operation at step S450, and transmitting the enable control signal at step S460.

First, the corresponding semiconductor chip determines whether a circuit operation to perform is the peak current operation or not at step S410, before performing the circuit operation. When the circuit operation is not the peak current operation (No), it means that the circuit operation does not have a large effect on the entire current consumption even though the semiconductor chip performs the circuit operation. The semiconductor chip performs a normal current operation at step 420 and completes the circuit operation.

On the other hand, when the circuit operation to perform is the peak current operation according to the determination result of step S410 (Yes), the semiconductor chip determines whether the enable control signal was received or not, at step S430. When the enable control signal was not received (No), the semiconductor chip sets the circuit operation in a standby state at step S440 and repetitively checks whether the enable control signal was received or not. Instead of repeating the step S430, another circuit operation may be additionally carried out at step S410, depending on the different designs.

When the enable control signal was received according to the determination result of step S430 (Yes), it means that the semiconductor chip has a right to perform the peak current operation. Therefore, the semiconductor chip performs the peak current operation at step S450. Furthermore, after the peak current operation, the semiconductor chip transmits the enable control signal to another semiconductor chip at step S460 and completes the circuit operation.

The semiconductor chip in accordance with the embodiment of the present invention waits for the peak current operation when the enable control signal is not received, and it performs the peak current operation when the enable control signal is received. Furthermore, normal current operations excluding the peak current operation may be performed regardless of the enable control signal.

In the multi-chip package in accordance with the embodiment of the present invention, a semiconductor chip receiving the enable control signal, among the plurality of semiconductor chips, performs the peak current operation and transmits the enable control signal to another semiconductor chip. Therefore, the multi-chip package in accordance with the embodiment of the present invention may avoid the peak current operation periods of the respective semiconductor chips overlapping each other, through the above-described operation. Accordingly, the multi-chip package may prevent a malfunction caused by the peak current.

While the present invention has been described with respect to the specific embodiments, it will be apparent to those skilled in the art that various changes and modifications may be made without departing from the spirit and scope of the invention as defined in the following claims.

For example, FIG. 3 illustrates that the line for transmitting the enable control signal and the line for transmitting the peak current operation information are separately arranged. However, the enable control signal and the peak current information may be transmitted through the same line.

What is claimed is:
1. A multi-chip package, comprising:
   first and second semiconductor chips each configured to perform first and second operations having different current consumptions,
   wherein the first and second semiconductor chips are configured to perform the first operation in response to an enable control signal transmitted from one of the first and second semiconductor chips to the other and transmitted from the other back to the one.
2. The multi-chip package of claim 1, wherein the one of the first and second semiconductor chip performs the first operation first and the other performs the first operation after the one completes the first operation.
3. The multi-chip package of claim 1, further comprising a signal transmission line connected between the first and second semiconductor chips and configured to transmit the enable control signal.
4. The multi-chip package of claim 1, further comprising:
   a first signal transmission line configured to transmit the enable control signal outputted from the first semiconductor chip to the second semiconductor chip; and
   a second signal transmission line configured to transmit the enable control signal outputted from the second semiconductor chip to the first semiconductor chip.
5. The multi-chip package of claim 1, wherein the enable control signal is generated by the first or second semiconductor chip.
6. The multi-chip package of claim 1, wherein the first operation has a larger current consumption than the second operation,
   wherein the first and second semiconductor chips are configured to perform the second operation regardless of the enable control signal.

7. A multi-chip package system comprising:
a plurality of semiconductor chips each configured to perform first and second operations having different current consumptions; and
a controller configured to select one of the plurality of semiconductor chips to generate an enable control signal and circulate the enable control signal through the plurality of semiconductor chips,
wherein the plurality of semiconductor chips are controlled to perform the first operation in response to the enable control signal.

8. The multi-chip package system of claim 7, wherein the plurality of semiconductor chips perform the first operation sequentially,
wherein after one of the plurality of semiconductor chips completes the first operation, another of the plurality of semiconductor chips performs the first operation in sequence to the one.

9. The multi-chip package system of claim 7, wherein the first operation has a larger current consumption than the second operation.

10. A multi-chip package system comprising:
a plurality of semiconductor chips each configured to perform first and second operations having different current consumptions and generate operation information corresponding to the first operation; and
a controller configured to transmit an enable control signal to the plurality of semiconductor chips in response to the operation information transmitted from the plurality of semiconductor chips.

11. The multi-chip package system of claim 10, wherein the plurality of semiconductor chips perform the first operation in response to the enable control signal and transmit the received enable control signal to the controller after completing the first operation.

12. The multi-chip package system of claim 10, wherein the plurality of semiconductor chips perform the first operation sequentially,
wherein after one of the plurality of semiconductor chips completes the first operation, another of the plurality of semiconductor chips performs the first operation in sequence to the one.

13. The multi-chip package system of claim 10, wherein the first operation has a larger current consumption than the second operation.

14. An operating method of a multi-chip package which includes a plurality of semiconductor chips each configured to perform a first operation in response to an enable control signal circulating through the plurality of semiconductor chips, comprising:
determining whether one of the semiconductor chips is selected to perform the first operation or not;
determining whether the one of the semiconductor chips receives the enable control signal or not in response to a result of the determining of whether the one of the semiconductor chips is selected or not;
performing the first operation in the one of the semiconductor chips in response to a result of the determining of whether the one of the semiconductor chips receives the enable control signal or not; and
transmitting the enable control signal from the one of the semiconductor chips to another of the semiconductor chips.

15. The operating method of claim 14, further comprising performing a second operation in the one of the semiconductor chips in response to the result of the determining of whether the one of the semiconductor chips is selected or not.

16. The operating method of claim 14, further comprising waiting for the first operation in response to the result of the determining of whether the one of the semiconductor chips receives the enable control signal or not.

17. The operating method of claim 14, wherein the first operation has a larger current consumption than the second operation.

* * * * *